(12) United States Patent
Kim

(10) Patent No.: US 7,679,931 B2
(45) Date of Patent: Mar. 16, 2010

(54) PLASMA DISPLAY APPARATUS HAVING IMPROVED STRUCTURE AND HEAT DISSIPATION

(75) Inventor: Yeung-Ki Kim, Suwon-si (KR)

(73) Assignee: Samsung SDI Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 872 days.

(21) Appl. No.: 11/449,739

(22) Filed: Jun. 9, 2006

(65) Prior Publication Data
US 2006/0291162 A1     Dec. 28, 2006

(30) Foreign Application Priority Data
Jun. 28, 2005   (KR) ................. 10-2005-0056057

(51) Int. Cl.
*H05K 9/00* (2006.01)
(52) U.S. Cl. .............. 361/799; 361/753; 361/800; 361/816; 361/818; 174/350
(58) Field of Classification Search ........... 361/753, 361/799, 800, 816, 818; 174/350
See application file for complete search history.

(56) References Cited

U.S. PATENT DOCUMENTS

| | | |
|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Shinoda et al. |
| 5,724,054 A | 3/1998 | Shinoda |
| 5,786,794 A | 7/1998 | Kishi et al. |
| 5,952,782 A | 9/1999 | Nanto |
| RE37,444 E | 11/2001 | Kanazawa |
| 6,630,916 B1 | 10/2003 | Shinoda |
| 6,707,436 B2 | 3/2004 | Setoguchi et al. |
| 6,946,798 B2 * | 9/2005 | Kawaguchi et al. ........... 315/85 |
| 7,059,473 B2 * | 6/2006 | Watanabe et al. ........... 206/454 |
| 7,133,281 B2 * | 11/2006 | Bae ........................ 361/679.21 |
| 7,164,586 B2 * | 1/2007 | Lin ............................ 361/714 |

(Continued)

FOREIGN PATENT DOCUMENTS

JP        02-148645        6/1990

(Continued)

OTHER PUBLICATIONS

*Office Action* from the European Patent Office issued in Applicant's corresponding European Patent Application No. 06 115 878.8-2208 dated Dec. 18, 2006.

(Continued)

*Primary Examiner*—Dameon E Levi
(74) *Attorney, Agent, or Firm*—Robert E. Bushnell, Esq.

(57) ABSTRACT

A plasma display apparatus comprises a plasma display panel and a chassis disposed on a rear portion of the plasma display panel to support the plasma display panel. The chassis is formed of plastic, and thus the weight of the plasma display apparatus is reduced. A conductive grounding member is disposed between the chassis and the plasma display panel. The apparatus further comprises a circuit unit having a grounding portion electrically connected to the conductive grounding member. A thermal conductive sheet is disposed between the plasma display panel and the chassis.

17 Claims, 5 Drawing Sheets

U.S. PATENT DOCUMENTS

| | | | |
|---|---|---|---|
| 7,274,559 B2* | 9/2007 | Kim | 361/679.27 |
| 7,315,451 B2* | 1/2008 | Kim et al. | 361/704 |
| 7,323,808 B2* | 1/2008 | Kim et al. | 313/44 |
| 7,342,792 B2* | 3/2008 | Kim et al. | 361/704 |
| 7,357,645 B2* | 4/2008 | Jeong et al. | 439/66 |
| 7,364,442 B2* | 4/2008 | Bang et al. | 439/92 |
| 7,372,700 B2* | 5/2008 | Jeong | 361/704 |
| 7,394,186 B2* | 7/2008 | Kim | 313/46 |
| 7,414,849 B2* | 8/2008 | Jeong | 361/710 |
| 7,423,377 B2* | 9/2008 | Kim et al. | 313/582 |
| 7,423,878 B2* | 9/2008 | Kim | 361/704 |
| 7,433,178 B2* | 10/2008 | Bang et al. | 361/679.27 |
| 7,457,120 B2* | 11/2008 | Bae et al. | 361/704 |
| 2002/0147423 A1 | 10/2002 | Burbank et al. | |
| 2002/0195937 A1 | 12/2002 | Kim | |
| 2005/0062383 A1 | 3/2005 | Bae | |
| 2006/0163987 A1 | 7/2006 | Kim | |

FOREIGN PATENT DOCUMENTS

| | | |
|---|---|---|
| JP | 2845183 | 10/1998 |
| JP | 2917279 | 4/1999 |
| JP | H11-242442 | 9/1999 |
| JP | H11-338370 | 12/1999 |
| JP | 2000-137440 | 5/2000 |
| JP | 2000-181370 | 6/2000 |
| JP | 2001-043804 | 2/2001 |
| JP | 2001-325888 | 11/2001 |
| JP | 2002-006756 | 1/2002 |
| JP | 2002-123178 | 4/2002 |
| JP | 2003-202811 | 7/2003 |
| JP | 2005-115383 | 4/2005 |
| JP | 2005-128554 | 5/2005 |
| KR | 10-2005-0000136 | 1/2005 |
| KR | 10-2006-0086218 | 7/2006 |

OTHER PUBLICATIONS

*Office Action* from the European Patent Office issued in Applicant's corresponding European Patent Application No. 06 115 878.8-2208 dated Sep. 9, 2008.

European Search Report for corresponding Korean Patent Application No. 2005-0056057, issued on Nov. 21, 2006.

International Display Workshops in Conjunction with Asia Display: "*Chassis Structure Design of a 42 Inch PDP Module for Reduced Cost and Weight,*" to Jeong, et al.;XP009072663, published on Dec. 6, 2005.

Korean Office Action for corresponding Korean Patent Application No. 2005-0056057, issued on Nov. 17, 2006.

Japanese Office Action dated Jan. 13, 2009 in corresponding Japanese Patent Application No. 2006-145630.

Office action from the Chinese Patent Office issued in Applicant's corresponding Chinese Patent Application No. 200610100150 dated Mar. 13, 2009.

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

\* cited by examiner

PLASMA DISPLAY APPARATUS HAVING IMPROVED STRUCTURE AND HEAT DISSIPATION

CLAIM OF PRIORITY

This application makes reference to, incorporates the same herein, and claims all benefits accruing under 35 U.S.C.§119 from an application for PLASMA DISPLAY APPARATUS earlier filed in the Korean Intellectual Property Office on the 28th of Jun. 2005 and there duly assigned Serial No. 10-2005-0056057.

BACKGROUND OF THE INVENTION

1. Technical Field

The present invention relates to a plasma display apparatus and, more particularly, to a plasma display apparatus having reduced weight.

2. Related Art

Flat panel display apparatuses using liquid crystal displays or plasma display panels are widely used to display images. In particular, plasma display apparatuses can be used to provide a large screen with superior characteristics in terms of image quality, thickness, weight, and viewing angle, and are easily fabricated.

In general, a plasma display apparatus includes a plasma display panel, a chassis, and a circuit unit. When the size of the plasma display panel is increased, the size of the chassis supporting the plasma display panel must also be increased. However, since the chassis is generally formed of aluminum, the weight of the chassis greatly increases when the size of the chassis increases, and thus, productivity when fabricating the chassis is degraded and fabrication costs of the chassis increase.

SUMMARY OF THE INVENTION

The present invention provides a plasma display apparatus having a reduced weight.

The present invention also provides a plasma display apparatus having a circuit unit with improved grounding stability.

The present invention further provides a plasma display apparatus having a structure with improved heat dissipation of the plasma display panel.

According to an aspect of the present invention, a plasma display apparatus comprises: a plasma display panel; and a chassis which is formed of plastic, and which is disposed on a rear portion of the plasma display panel to support the plasma display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
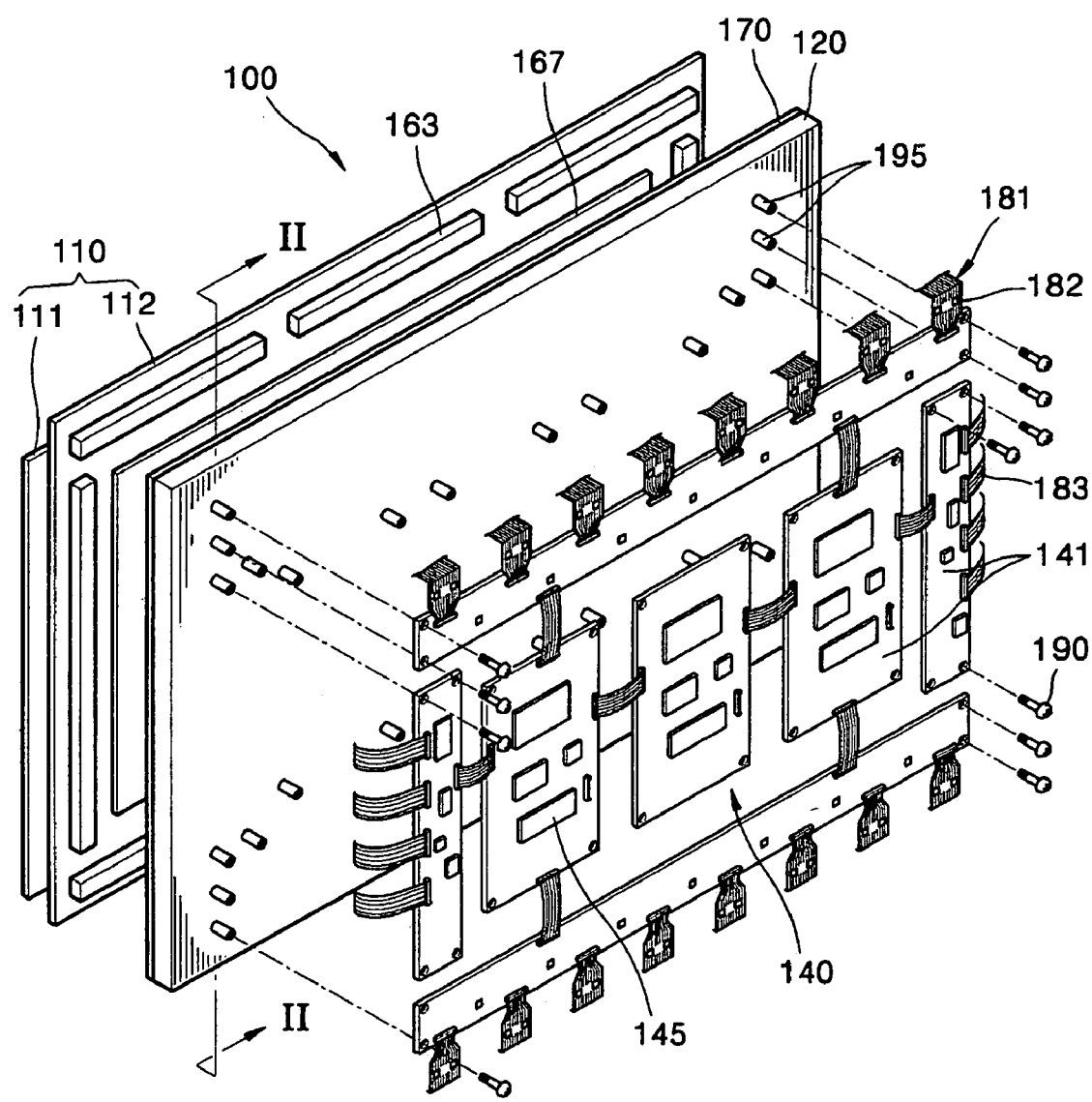
FIG. 1 is an exploded perspective view of a plasma display apparatus according to an embodiment of the present invention.
Figure 2:
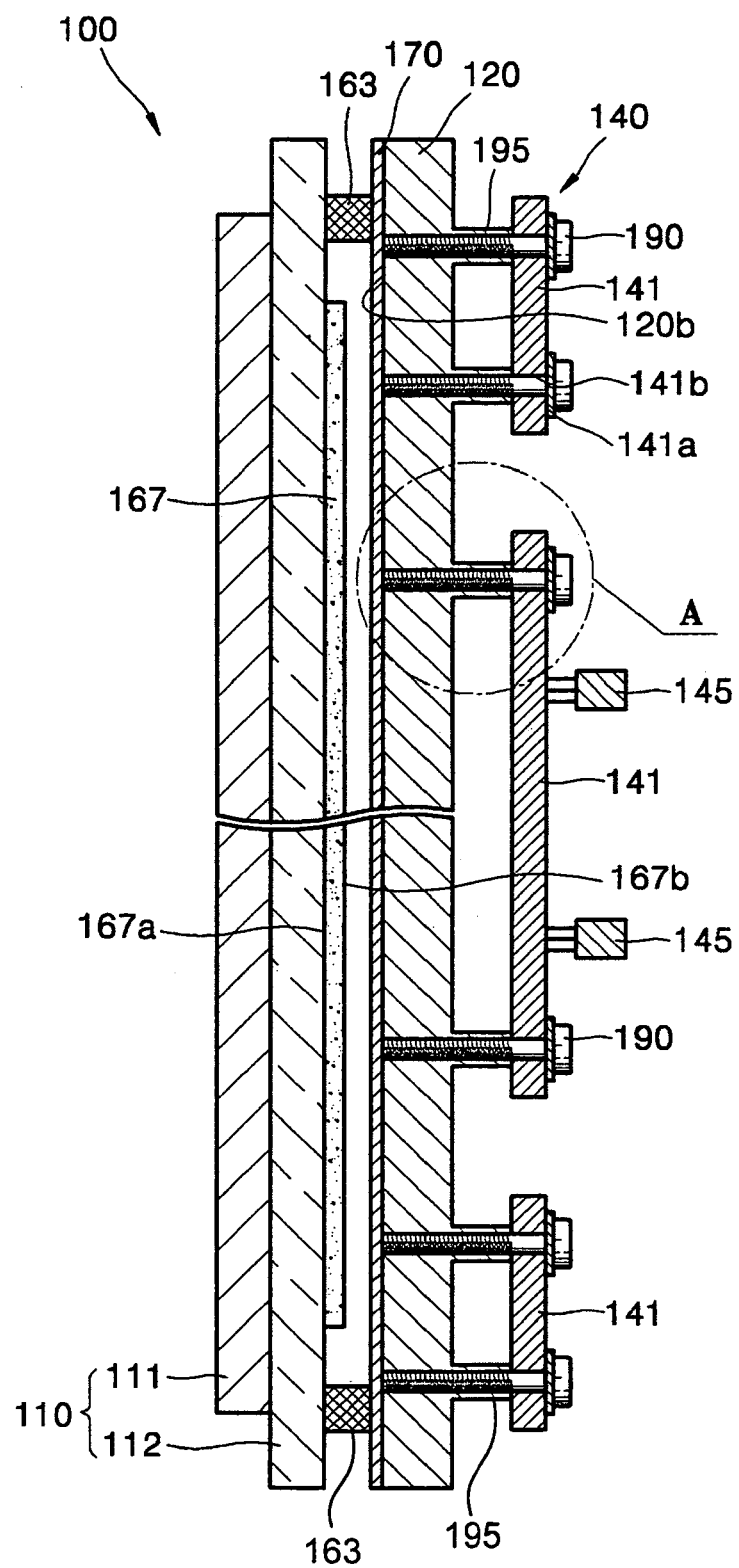
FIG. 2 is a cross-section view taken along section line II-II of FIG. 1.

FIG. 1 is an exploded perspective view of a plasma display apparatus according to an embodiment of the present invention, and FIG. 2 is a cross-section view taken along section line II-II of FIG. 1.

Referring to FIGS. 1 and 2, a plasma display apparatus comprises a plasma display panel 110 which displays an image using a gas discharge, and which includes a front panel 111 and a rear panel 112 coupled to each other.

A chassis 120 is disposed on a rear portion of the plasma display panel 110 to support the plasma display panel 110. The chassis 120 is preferably formed of a plastic material, for example, polystyrene, acrylonitrile-butadiene-styrene (ABS), or poly butylenes terephthalate (PBT). The polystyrene may be high impact polystyrene (HIPS). Since plastic is generally lighter than metal, and since the chassis can be fabricated in various sizes and shapes through an injection molding process using the plastic, manufacturing efficiency for fabricating the chassis can be improved greatly.

In prior plasma display apparatuses, a process of forcibly inserting an additional boss into the chassis to support a circuit board has been required. Therefore, the number of processes and the rate of defect has been large, and thus fabrication costs have been too large.

In contrast, as shown in FIGS. 1 and 2, when the chassis 120 is formed of plastic, bosses 195 can be integrally formed with the chassis 120, and thus manufacturing efficiency can be improved greatly and the fabrication costs of the chassis 120 are reduced.

A grounding member 170 is disposed between the plasma display panel 110 and the chassis 120. More specifically, the grounding member 170 is attached to a front surface 120b of the chassis 120 (see FIG. 2). The grounding member 170 entirely covers the front surface 120b of the chassis 120 in order to increase the grounding area. However, the grounding member 170 may partially cover the front surface 120b of the chassis 120. The grounding member 170 may be formed of a conductive material such as steel, aluminum, or copper. In addition, the grounding member 170 can be formed in various shapes. However, in a preferred embodiment of the present invention, the grounding member 170 may be formed as a thin film in consideration of the overall weight of the plasma display apparatus 100 and in order to improve the coupling force with the chassis 120.

A thermal conductive sheet 161 is disposed between the plasma display panel 110 and the chassis 120. A first surface 167a of the thermal conductive sheet 167 is fixed to the rear panel 112 of the plasma display panel 110 by an adhesive agent (not shown), and a second surface 167b of the thermal conductive sheet 167 is separated by a predetermined distance from the grounding member 170 and the chassis 120. The thermal conductive sheet 167 diffuses the heat transmitted from the plasma display panel 110, or performs a thermal exchange with the air between the grounding member 170 and the plasma display panel 110 so as to dissipate the heat.

The plasma display panel 110 and the grounding member 170 are fixed to each other by dual-adhesive tapes 163. However, holes corresponding to the dual-adhesive tapes 163 may be formed in the grounding member 170 in order to couple the plasma display panel 110 directly to the chassis 120 with the dual-adhesive tapes 163.

A circuit unit 140 is disposed on a rear portion of the chassis 120. The circuit unit 140 includes a plurality of substrates 141 for driving the plasma display panel 110. The substrates 141 are separated by a predetermined distance from the chassis base 120 by bosses 195 having screw threads formed on inner circumferential surfaces 195a (see FIG. 3) thereof. The bosses 195 are integrally formed with the chassis 120.

Figure 3:
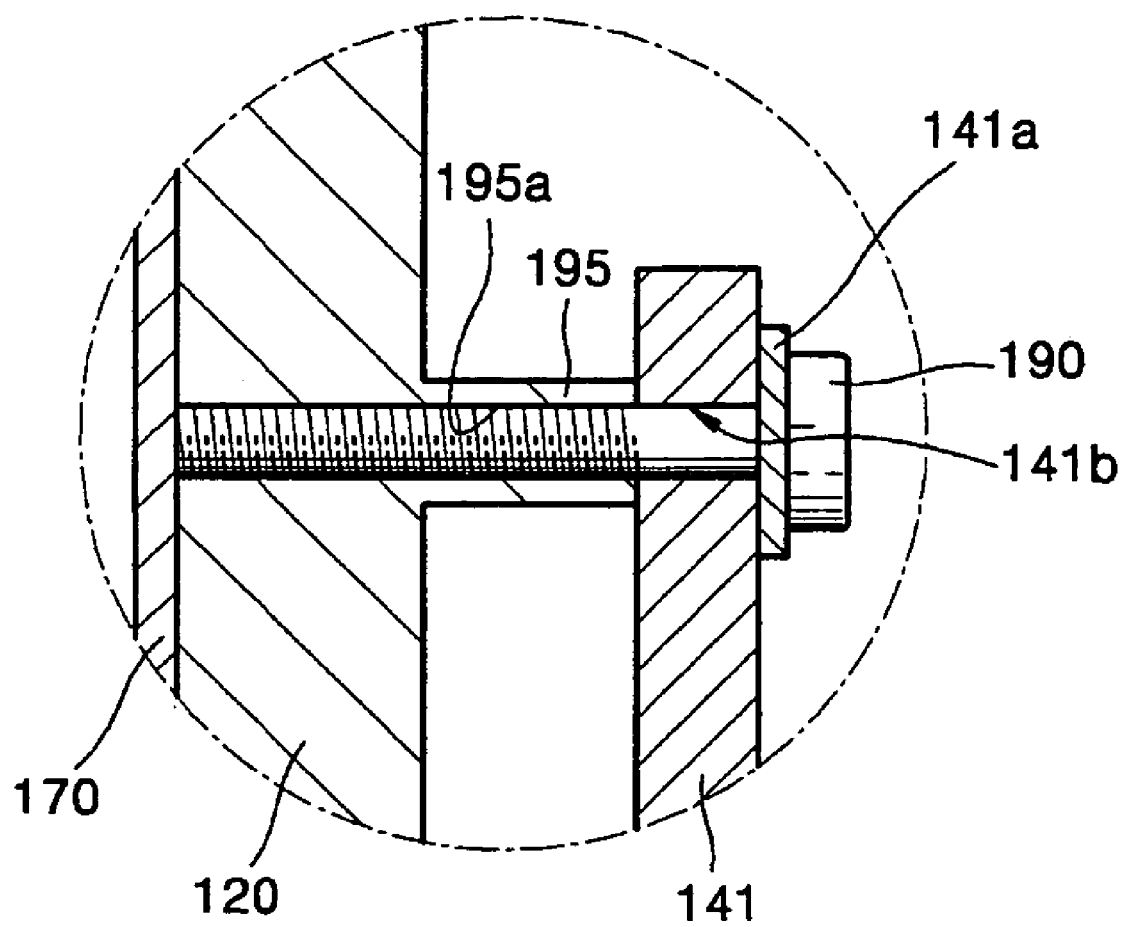
FIG. 3 is an enlarged view of a portion A of FIG. 2.

FIG. 3 is an enlarged view of a portion A of FIG. 2.

Referring to FIG. 3, circuit lines (not shown) for processing electric signals are formed on the substrates 141, and electronic devices 145 are mounted on the circuit lines. At least one of the circuit lines is a circuit line supplying a ground potential. Penetration holes 141b, into which conductive screws 190 which will be screwed into the bosses 195 are inserted, are formed in the substrates 141. A grounding portion 141a surrounding at least one of the penetration holes 141b is formed on each of the substrates 141, and the grounding portions 141a are electrically connected to the circuit line supplying the grounding electric potential. As described above, the conductive screws 190 are inserted into the penetration holes 141b so as to be coupled to the bosses 195.

As also shown in FIG. 3, the screws 190 penetrate through the chassis 120, and end portions of the screws 190 contact the grounding member 170. Since the grounding portion 141a, the screws 190, and the grounding member 170 are electrically connected to each other by the screws 190 contacting the grounding portion 141a, the grounding member 170 can supply the ground potential to the substrates 141. Therefore, stable grounding of the circuit unit 140 is possible.

The circuit unit 140 transmits electric signals to the plasma display panel 110 through signal transmission members, for example, flexible printed cables (FPCs), tape carrier packages (TCPs), or chip on films (COFs). In the present embodiment, the signal transmission members disposed on upper and lower portions of the chassis 120 (see FIG. 1) are TCPs 181, and the signal transmission members disposed on left and right portions of the chassis 120 are FPCs 183.

A cover member (not shown) may surround the TCPs 181, on which electronic devices 182 are mounted. The cover member dissipates heat generated by the electronic devices 182 to the outside, and prevents damage to the TCPs 181.

Figure 4:
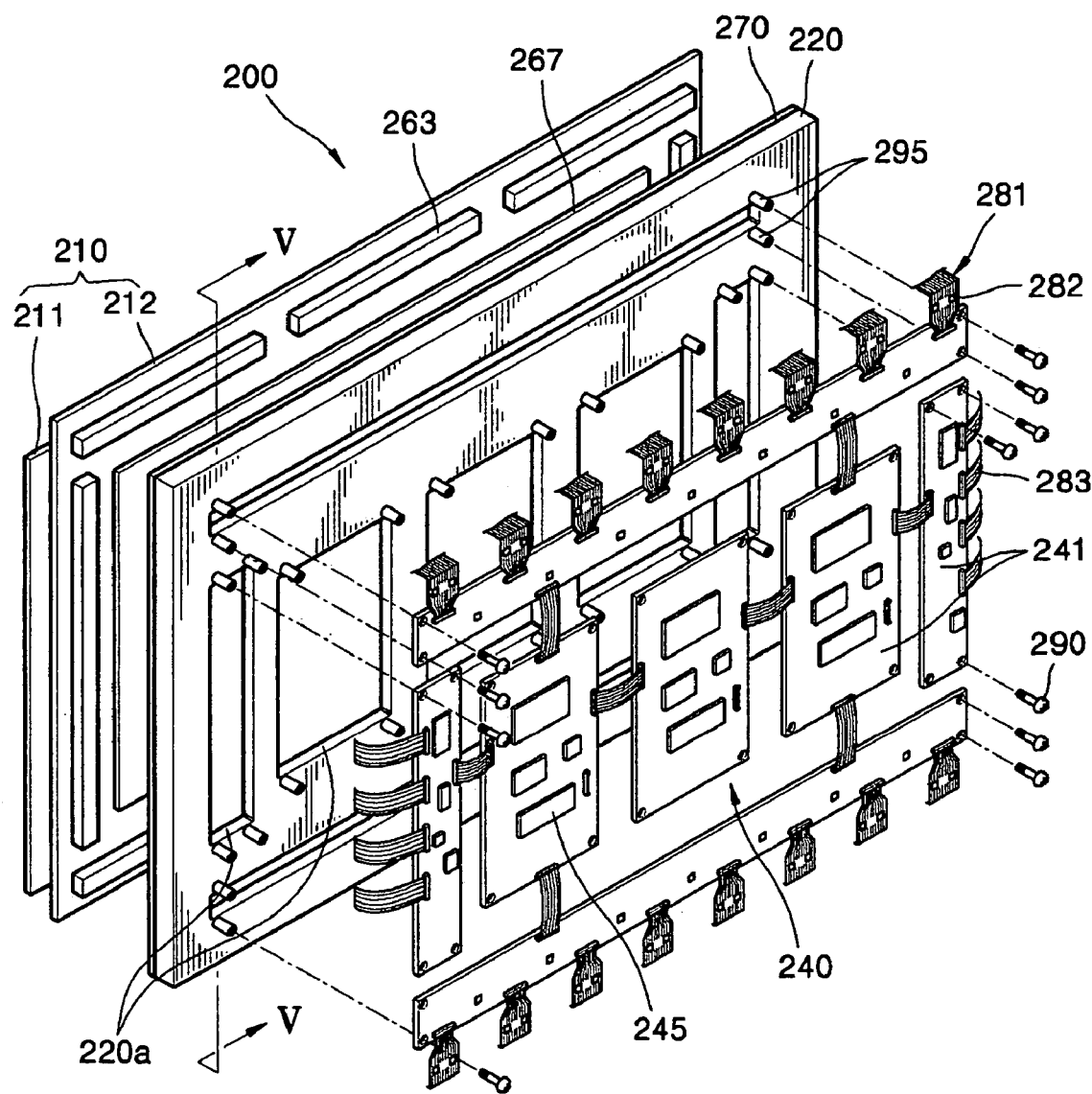
FIG. 4 is an exploded perspective view of the plasma display apparatus according to another embodiment of the present invention.
Figure 5:
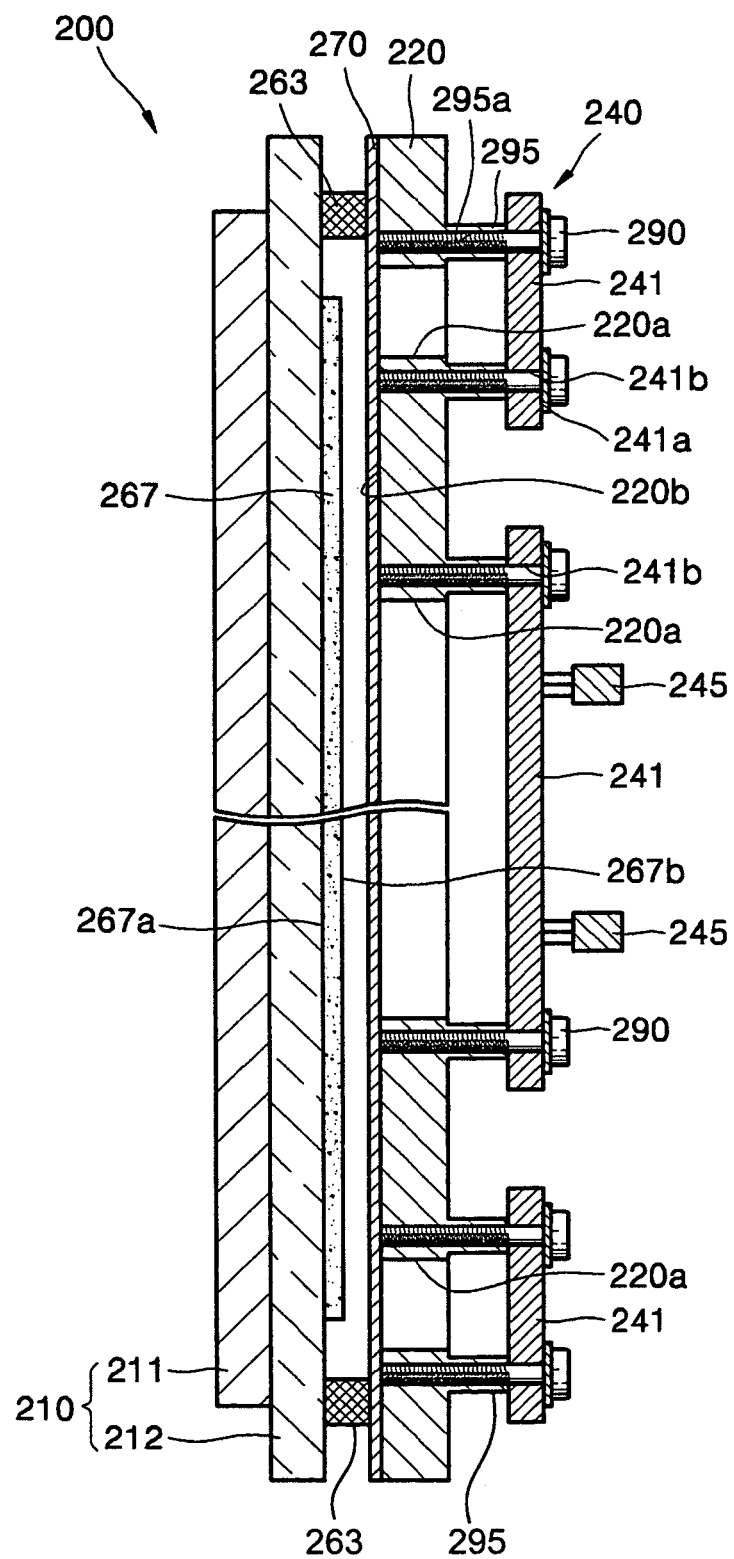
FIG. 5 is a cross-section view taken along section line V-V of FIG. 4.

FIG. 4 is an exploded perspective view of the plasma display apparatus according to another embodiment of the present invention, and FIG. 5 is a cross-section view taken along section line V-V of FIG. 4.

Hereinafter, characteristics of the plasma display apparatus 200 which are identical to those of the plasma display apparatus 100 will not be described.

Referring to FIGS. 4 and 5, the plasma display apparatus 200 comprises a plasma display panel 210 which displays an image using a gas discharge, and which includes a front panel 211 and a rear panel 212 coupled to each other.

A chassis 220 is disposed on a rear portion of the plasma display panel 210 to support the plasma display panel 210. The chassis 220 may be formed of a plastic, for example, polystyrene, acrylonitrile-butadiene-styrene (ABS), or polybutylenes terephthalate (PBT). The polystyrene may be high impact polystyrene (HIPS). Since the chassis 220 is formed of plastic, the weight of the chassis 220 is reduced, manufacturing efficiency is improved, and fabrication costs of the chassis 220 are reduced. A circuit unit 240 is disposed on a rear portion of the chassis 220, and holes 220a are formed in portions of the chassis 220 corresponding to the circuit unit 240. The weight of the chassis 220 is reduced by forming the cut portions 220a.

Referring to FIG. 5, a grounding member 270 is disposed between the plasma display panel 210 and the chassis 220. More specifically, the grounding member 270 is attached to a front surface 220b of the chassis 220. The grounding member 270 is formed of a conductive material, for example, a metal such as steel, aluminum, or copper. The grounding member 270 may be formed as a thin sheet. The plasma display panel 210 and the grounding member 270 are fixed to each other by dual-adhesive tapes 263.

The circuit unit 240 includes a plurality of substrates 241 for driving the plasma display panel 210. The substrates 241 are supported by bosses 295 having screw threads on inner circumferential surfaces 295a thereof. Circuit lines (not shown) for processing electric signals are formed on the substrates 241, and electronic devices 245 are mounted on the circuit lines. Penetration holes 241b, into which screws 290 which will be screwed into the bosses 295 are inserted, are formed in the substrates 241. A grounding portion 241a surrounding at least one of the penetration holes 241b is formed on each of the substrates 241, and the grounding portions 241a are electrically connected to the circuit line supplying the ground potential. Since the screws 290 are inserted into the penetration holes 241b so as to electrically connect the grounding portion 241a to the grounding member 270, grounding stability of the circuit unit 240 is improved.

The circuit unit 240 transmits electric signals to the plasma display panel 210 via signal transmission members, such as TCPs 281 and FPCs 283. Electronic devices 282 are mounted on the TCPs 281, and a cover member (not shown) can cover the electronic devices 282.

A thermal conductive sheet 267 is disposed between the plasma display panel 210 and the chassis 220. A first surface 267a of the thermal conductive sheet 267 is fixed to the rear panel 212 of the plasma display panel 210 by an adhesive agent (not shown), and a second surface 267b of the thermal conductive sheet 267 is separated by a predetermined distance from the grounding member 270 and the chassis 220. As described above, since the holes 220a are formed in the chassis 220 so as to correspond to the substrates 241, the amount of air flowing across the second surface 267b of the thermal conductive sheet 267 is increased due to the cut portions 220a. Therefore, the air can flow sufficiently, and thus, heat dissipation through the thermal conductive sheet is improved. Moreover, since the increased airflow occurs around the substrates 241, the heat from the substrates 241 and the electronic devices 245 mounted on the substrates 241 is dissipated sufficiently.

In the plasma display apparatus of the present invention, since the chassis is formed of plastic, the weight of the chassis is reduced. In addition, since the chassis has holes formed therein, the weight of the plasma display apparatus is further reduced. Therefore, even when the plasma display apparatus is enlarged, problems caused by weight increase are prevented. In addition, the amount of materials used to fabricate the chassis is reduced, and thus, fabrication costs are lowered.

In addition, the grounding unit of the circuit unit is electrically connected to the grounding member, and thus, the grounding stability of the circuit unit is greatly improved.

Since the air can sufficiently flow to the thermal conductive sheet due to the presence of holes in the chassis, the heat generated by the plasma display panel and the circuit unit is dissipated sufficiently.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A plasma display apparatus, comprising:
   a plasma display panel;
   a chassis formed of at least plastic and disposed on a rear portion of the plasma display panel to support the plasma display panel;
   a circuit unit disposed on a rear portion of the chassis for driving the plasma display panel; and
   a conductive grounding member disposed between the chassis and the plasma display panel.

2. The plasma display apparatus of claim 1, wherein the chassis is formed of at least one plastic selected from the group consisting of polystyrene, acrylonitrile-butadiene-styrene (ABS), and poly butylenes terephthalate (PBT).

3. The plasma display apparatus of claim 1, wherein the chassis has at least one hole formed therein.

4. The plasma display apparatus of claim 1, wherein the chassis has at least one hole formed therein in correspondence to the circuit unit.

5. The plasma display apparatus of claim 1, wherein the conductive grounding member is adhered to a front surface of the chassis.

6. The plasma display apparatus of claim 1, wherein the conductive grounding member is formed of at least a metal.

7. The plasma display apparatus of claim 6, wherein the conductive grounding member is formed of at least one metal selected from the group consisting of steel, copper, and aluminum.

8. The plasma display apparatus of claim 1, wherein the conductive grounding member comprises a thin sheet.

9. The plasma display apparatus of claim 1, wherein the circuit unit includes a grounding portion having a ground potential, and the grounding portion is electrically connected to the conductive grounding member.

10. A plasma display apparatus, comprising:
    a plasma display panel;
    a chassis formed of at least plastic and disposed on a rear portion of the plasma display panel to support the plasma display panel;
    a circuit unit disposed on a rear portion of the chassis for driving the plasma display panel; and
    a conductive grounding member disposed between the chassis and the plasma display panel;
    wherein the circuit unit includes a grounding portion having a ground potential, and the grounding portion is electrically connected to the conductive grounding member;
    said apparatus further comprising a conductive member inserted through a penetration hole formed in the circuit unit, and wherein the grounding portion is electrically connected to the conductive grounding member via the conductive member.

11. The plasma display apparatus of claim 10, wherein the conductive member comprises a screw.

12. The plasma display apparatus of claim 11, further comprising a boss disposed between the chassis and the penetration hole, the screw being inserted into the boss.

13. The plasma display apparatus of claim 1, further comprising a thermal conductive sheet disposed between the plasma display panel and the chassis, wherein a surface of the thermal conductive sheet contacts the plasma display panel, and another surface of the thermal conductive sheet is separated by a predetermined distance from the chassis.

14. A plasma display apparatus, comprising:
    a plasma display panel;
    a chassis formed of at least plastic and disposed on a rear portion of the plasma display panel to support the plasma display panel; and
    a conductive grounding member disposed between the chassis and the plasma display panel;
    wherein the conductive grounding member is adhered to a front surface of the chassis.

15. The plasma display apparatus of claim 14, wherein the conductive grounding member is formed of at least a metal.

16. The plasma display apparatus of claim 15, wherein the conductive grounding member is formed of at least one metal selected from the group consisting of steel, copper, and aluminum.

17. The plasma display apparatus of claim 14, wherein the conductive grounding member comprises a thin sheet.

* * * * *